United States Patent
Kim et al.

(10) Patent No.: US 9,142,639 B2
(45) Date of Patent: Sep. 22, 2015

(54) GRAPHENE ELECTRONIC DEVICES AND METHODS OF MANUFACTURING THE SAME

(71) Applicant: Samsung Electronics Co., Ltd., Suwon-Si, Gyeonggi-Do (KR)

(72) Inventors: Yong-sung Kim, Namyangju-si (KR); Chang-seung Lee, Yongin-si (KR); Joo-ho Lee, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 13/975,680

(22) Filed: Aug. 26, 2013

(65) Prior Publication Data

US 2014/0191198 A1    Jul. 10, 2014

(30) Foreign Application Priority Data

Jan. 8, 2013  (KR) .................... 10-2013-0002223

(51) Int. Cl.
| | |
|---|---|
| H01L 29/16 | (2006.01) |
| H01L 29/66 | (2006.01) |
| B82Y 10/00 | (2011.01) |
| H01L 21/28 | (2006.01) |
| H01L 29/423 | (2006.01) |
| H01L 29/778 | (2006.01) |
| H01L 29/788 | (2006.01) |
| H01L 27/115 | (2006.01) |
| H01L 29/78 | (2006.01) |

(52) U.S. Cl.
CPC ........... *H01L 29/66477* (2013.01); *B82Y 10/00* (2013.01); *H01L 21/28273* (2013.01); *H01L 21/28291* (2013.01); *H01L 27/1159* (2013.01); *H01L 27/11521* (2013.01); *H01L 29/1606* (2013.01); *H01L 29/42328* (2013.01); *H01L 29/66045* (2013.01); *H01L 29/778* (2013.01); *H01L 29/7881* (2013.01); *H01L 29/78391* (2014.09)

(58) Field of Classification Search
CPC ..................... H01L 29/1606; H01L 21/02527; H01L 29/66477; H01L 29/7391
See application file for complete search history.

(56) References Cited

U.S. PATENT DOCUMENTS

| | | | | |
|---|---|---|---|---|
| 8,101,980 | B2* | 1/2012 | Heo et al. ............... | 257/288 |
| 8,809,837 | B2* | 8/2014 | Farmer et al. .......... | 257/24 |
| 2007/0001220 | A1* | 1/2007 | Tombler et al. ........ | 257/330 |
| 2010/0055388 | A1* | 3/2010 | Chen et al. ............. | 428/119 |
| 2010/0200839 | A1* | 8/2010 | Okai et al. ............. | 257/29 |
| 2010/0320445 | A1* | 12/2010 | Ogihara et al. ......... | 257/26 |
| 2011/0017979 | A1 | 1/2011 | Meric et al. | |
| 2011/0114918 | A1* | 5/2011 | Lin et al. ............... | 257/24 |

(Continued)

FOREIGN PATENT DOCUMENTS

| | | |
|---|---|---|
| JP | 2009-277803 A | 11/2009 |
| JP | 2012-138451 A | 7/2012 |

(Continued)

*Primary Examiner* — Jaehwan Oh
(74) *Attorney, Agent, or Firm* — Harness, Dickey & Pierce, P.L.C.

(57) ABSTRACT

A graphene electronic device includes: a first conductive layer and a semiconductor layer on a first region of an intermediate layer; a second conductive layer on a second region of the intermediate layer; a graphene layer on the intermediate layer, the semiconductor layer, and the second conductive layer; and a first gate structure and a second gate structure on the graphene layer.

27 Claims, 6 Drawing Sheets

(56) References Cited

U.S. PATENT DOCUMENTS

| | | | |
|---|---|---|---|
| 2011/0175060 A1* | 7/2011 | Okai et al. | 257/29 |
| 2011/0309336 A1* | 12/2011 | Shin et al. | 257/29 |
| 2012/0112250 A1* | 5/2012 | Chung et al. | 257/288 |
| 2012/0168724 A1* | 7/2012 | Park et al. | 257/29 |
| 2013/0001516 A1* | 1/2013 | Hebard et al. | 257/29 |
| 2013/0048951 A1* | 2/2013 | Heo et al. | 257/29 |
| 2013/0140526 A1* | 6/2013 | Kim et al. | 257/29 |
| 2013/0171781 A1* | 7/2013 | Lee et al. | 438/197 |
| 2013/0292573 A1* | 11/2013 | Antonuk | 250/361 R |
| 2014/0057425 A1* | 2/2014 | Afzali-Ardakani et al. | 438/594 |
| 2014/0159040 A1* | 6/2014 | Dimitrakopoulos et al. | 257/48 |

FOREIGN PATENT DOCUMENTS

| | | |
|---|---|---|
| KR | 2011-0041791 A | 4/2011 |
| KR | 2011-0081183 A | 7/2011 |

\* cited by examiner

GRAPHENE ELECTRONIC DEVICES AND METHODS OF MANUFACTURING THE SAME

CROSS-REFERENCE TO RELATED APPLICATIONS

This application claims priority to Korean Patent Application No. 10-2013-0002223, filed on Jan. 8, 2013, in the Korean Intellectual Property Office, the disclosure of which is incorporated herein in its entirety by reference.

BACKGROUND

1. Field

Example embodiments relate to graphene electronic devices and methods of manufacturing the same.

2. Description of the Related Art

Rapidly, semiconductor devices formed on silicon substrates have become more highly integrated to have a relatively high performance. However, there is a limitation in improving the performance of semiconductor devices due to characteristics of silicon itself and in manufacturing processes. Accordingly, research has been conducted into next generation devices that may overcome the limitations of conventional semiconductor devices having silicon substrates.

Graphene, a graphite monoatomic layer, is being considered as a next generation material due to its superior electrical and mechanical properties. Graphene is a material in which carbon atoms are connected as a hexagon in a plane, and has a relatively small thickness corresponding to a monoatomic layer. Thus, graphene conducts electricity about a hundred times faster than polycrystalline silicon that is mainly used as a semiconductor, and theoretically has an electron mobility of about 200,000 $cm^2/Vs$. In addition, it is known that graphene may conduct electricity about a hundred times more than copper, and thus, graphene is considered as a basic material of electronic devices.

In particular, graphene is a zero gap semiconductor material, and thus, if a graphene nanoribbon (GNR) is manufactured to have a channel width of about 10 nm or less, a band gap is generated due to a size effect. Thus, a field effect transistor (FET) capable of operating at about room temperature may be manufactured.

Conventionally, graphene is grown on a metal thin film formed of copper (Cu) or nickel (Ni) by a chemical vapor deposition (CVD) method, and then, may be transferred onto an insulating thin film.

SUMMARY

Example embodiments provide graphene switching devices including graphene field effect transistors (FETs) and graphene diodes.

Example embodiments provide graphene memory devices formed by combining graphene FETs and graphene diodes.

Additional aspects will be set forth in part in the description which follows and, in part, will be apparent from the description, or may be learned by practice of the presented embodiments.

At least one example embodiment provides a graphene electronic device. According to at least this example embodiment, the graphene electronic device includes: a first conductive layer and a semiconductor layer on a first region of an intermediate layer; a second conductive layer on a second region of the intermediate layer; a graphene layer on the intermediate layer, the semiconductor layer, and the second conductive layer; and a first gate structure and a second gate structure on the graphene layer.

According to at least some example embodiments, the first gate structure may be formed on the graphene layer to correspond to the first region of the intermediate layer. The second gate structure may by formed on the graphene layer in a space between the first region and the second region of the intermediate layer. The intermediate layer may be formed on a support structure.

According to at least some example embodiments, the first gate structure may include a gate insulating layer and a first gate. The second gate structure may include the gate insulating layer and a second gate.

According to at least some example embodiments, the first gate structure may include a first ferroelectric layer and a first gate. The second gate structure may include a second ferroelectric layer and a second gate.

According to at least some example embodiments, the first gate structure may include a first tunneling oxide layer, a first floating gate, a first blocking oxide layer, and a first gate. The second gate structure may include a second tunneling oxide layer, a second floating gate, a second blocking oxide layer, and a second gate.

At least one other example embodiment provides a method of forming a graphene electronic device. According to at least this example embodiment, the method includes: forming a semiconductor layer, a first conductive layer, and a second conductive layer on a substrate; forming an intermediate layer on the substrate, the semiconductor layer, the first conductive layer, and the second conductive layer; removing the substrate, and forming a graphene layer on the intermediate layer, the semiconductor layer, and the second conductive layer; and forming a first gate structure and a second gate structure on the graphene layer.

According to at least some example embodiments, the method of forming a graphene electronic device may further include: forming a support structure on the intermediate layer, after forming the intermediate layer.

In at least one example embodiment, the substrate may include silicon and a silicon oxide layer, and the substrate may be removed by etching the silicon oxide layer. In at least one other example embodiment, the substrate may include a transparent substrate, and the substrate may be removed by a laser lift-off process.

The graphene layer may be formed on a catalyst layer by a pyrolisis method or a chemical vapor deposition (CVD) method, after forming the catalyst layer on the intermediate layer.

At least one other example embodiment provides a graphene electronic device. According to at least this example embodiment, the graphene electronic device includes: a graphene transistor having a channel including a graphene layer and an electrode including a semiconductor layer; and a graphene tunable diode having a diode region including the graphene layer and the semiconductor layer.

According to at least some example embodiments, the graphene transistor may include: a first conductive layer and the semiconductor layer on a first region of an intermediate layer; a second conductive layer on a second region of the intermediate layer; the graphene layer on the intermediate layer, the semiconductor layer, and the second conductive layer; and a gate structure on the graphene layer.

The graphene tunable diode may include: the semiconductor layer on a first region of an intermediate layer; the graphene layer on the intermediate layer and the semiconductor layer; and a gate structure on the graphene layer corresponding to the first region of the intermediate layer.

According to at least some example embodiments, the device may further include: a first conductive layer and the semiconductor layer on a first region of an intermediate layer; a second conductive layer on a second region of the intermediate layer; the graphene layer on the intermediate layer, the semiconductor layer, and the second conductive layer; and a first gate structure and a second gate structure on the graphene layer.

The device may further include a first gate structure corresponding to the graphene transistor; and a second gate structure corresponding to the graphene tunable diode.

According to at least some example embodiments, the gate structure may include a tunneling oxide layer, a floating gate, a blocking oxide layer, and a gate, or the gate structure may include a ferroelectric layer and a gate.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1A:
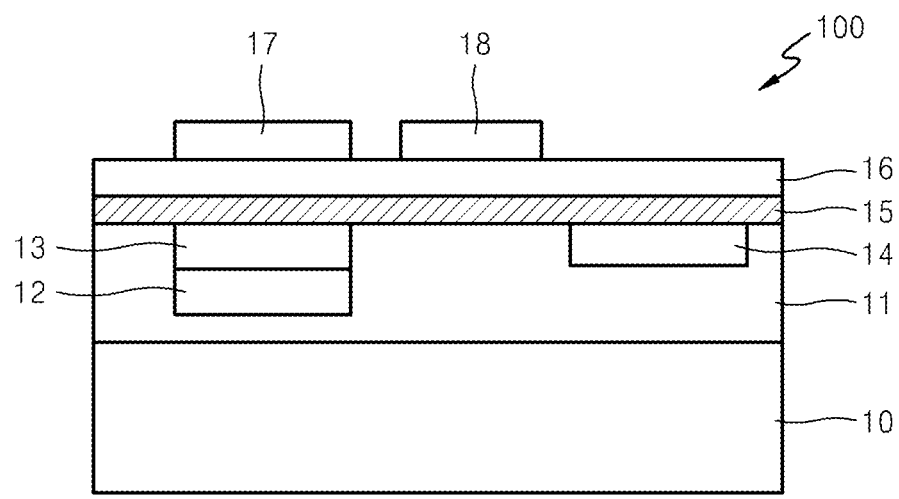
FIG. 1A is a cross-sectional view of a graphene electronic device according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments of the present invention will now be described more fully with reference to the accompanying drawings in which some example embodiments of the invention are shown. In the drawings, the thicknesses of layers and regions are exaggerated for clarity.

Figure 1B:
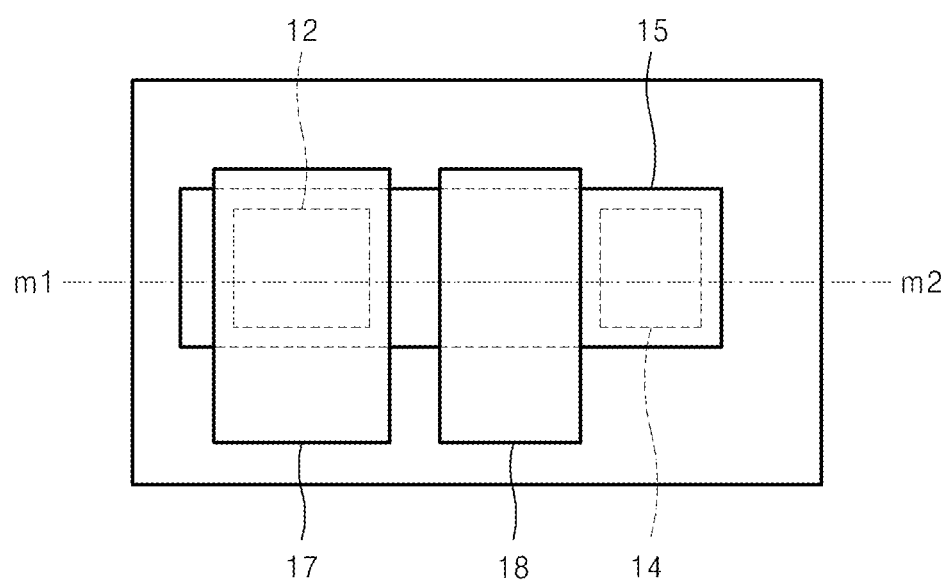
FIG. 1B is a schematic plan view of the graphene electronic device of FIG. 1.

FIG. 1A is a cross-sectional view of a graphene electronic device 100 according to an example embodiment. In addition, FIG. 1B is a schematic plan view of the graphene electronic device 100 shown in FIG. 1A. FIG. 1A is a cross-sectional view taken along line m1-m2 of FIG. 1B.

Referring to FIGS. 1A and 1B, the graphene electronic device 100 includes an intermediate layer 11 formed on a support structure 10, a first conductive layer 12 and a semiconductor layer 13 formed on a first region of the intermediate layer 11, and a second conductive layer 14 formed on a second region of the intermediate layer 11. In addition, a graphene layer 15 is formed on the intermediate layer 11, the semiconductor layer 13, and the second conductive layer 14. First and second gate structures are formed on the graphene layer 15. The first gate structure includes a gate insulating layer 16 and a first gate 17. The second gate structure includes the gate insulating layer 16 and a second gate 18. On the graphene layer 15, the first gate structure is formed corresponding to the first region of the intermediate layer 11, and the second gate structure is formed in a space between the first and second regions of the intermediate layer 11.

The graphene electronic device according to at least this example embodiment may be configured to perform functions of a graphene transistor and/or a graphene diode. Referring to FIG. 1A, the semiconductor layer 13 and the graphene layer 15 may be a diode region functioning as a graphene tunable diode according to a voltage applied via the first gate 17. In addition, regarding the graphene transistor function, the first conductive layer 12 and the semiconductor layer 13 in FIG. 1A may be a source electrode, the second conductive layer 14 may be a drain electrode, the graphene layer 15 may be a channel region, and the second gate 18 may be a gate electrode.

Materials forming each of the layers in the graphene electronic device according to at least this example embodiment are described below.

The support structure 10 supports each of the layers of the graphene electronic device formed thereon, and may be formed in manufacturing processes for processing stability. The support structure 10 may be formed of various materials, for example, a semiconductor substrate such as a Si substrate that is used as a substrate of a semiconductor device, a polymer substrate, an adhesive tape, etc. The support structure 10 may include a material having relatively high attachability to the intermediate layer 11, and if necessary, the support structure 10 may be formed of the same or substantially the same material as that of the intermediate layer 11.

The intermediate layer 11 may be formed of a polymer material, or a material having an insulating property. The intermediate layer 11 may be a protective layer that protects the graphene layer 15 and the first and second conductive layers 12 and 14 during forming of the graphene electronic device 100. The first conductive layer 12, the second conductive layer 14, the first gate 17, and the second gate 18 may be formed of a conductive material such as metal, a metal alloy, conductive metal oxide, conductive polymer, etc.

The semiconductor layer 13 may be formed of a semiconductor material, for example, a material including silicon (Si), amorphous silicon (a-Si), zinc-oxide (ZnO), gallium-indium-zinc-oxide (GaInZnOx), hafnium-indium-zinc-oxide (HfInZnOx), gallium-nitride (GaN), gallium-arsenic (GaAs), aluminum-gallium-arsenic (AlGaAs), etc., and may be formed to have a single or multi-layer structure. In addition, the semiconductor layer 13 may include a layer doped with impurities, for example, a-Si/n-type Si structure.

The gate insulating layer 16 may be formed of an insulating material such as that formed in a semiconductor device. For example, the gate insulating layer 16 may be silicon oxide, silicon nitride, aluminum oxide, hafnium oxide, zinc oxide, magnesium oxide, etc.

The graphene layer 15 may be formed by using various methods. For example, to form the graphene layer 15, a catalyst layer including nickel (Ni), copper (Cu), cobalt (Co), platinum (Pt), or ruthenium (Ru) may be formed first, and the graphene layer 15 may be formed on the catalyst layer, for example, by a pyrolysis method or a chemical vapor deposition (CVD) method.

Figure 2:
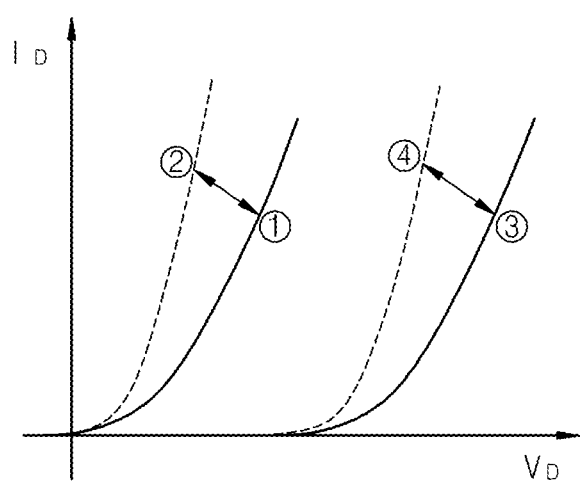
FIG. 2 is a graph showing electrical characteristics of the graphene electronic device according to an example embodiment.

FIG. 2 is a graph schematically showing example electrical characteristics of the graphene electronic device 100 shown in FIGS. 1A and 1B.

Referring to FIG. 2, an electric current according to a voltage applied via the first conductive layer 12 and the second conductive layer 14 in a state where a voltage is not applied to the first gate 17 and the second gate 18 (Vg1=1 and Vg2=0) follows graph 1.

When the voltage is not applied to the first gate 17 (Vg=0) and a voltage is applied to the second gate 18 (Vg2>0), the electric current increases according to the transistor characteristics illustrating graph 2. On the other hand, when a voltage is applied to the first gate 17 (Vg>0) and a voltage is not applied to the second gate 18 (Vg2=0), a turn-on voltage increases due to tunable diode characteristics as shown in graph 3. If the voltage is applied to both of the first gate 17 and the second gate 18 (Vg>0 and Vg2>0), the electric current and the turn-on voltage both increase as shown in graph 4 according to the transistor characteristics and the tunable diode characteristics.

Hereinafter, an example embodiment of a method of manufacturing a graphene electronic device is described with reference to FIGS. 3A through 3D.

FIGS. 3A through 3D are diagrams illustrating an example embodiment of a method of manufacturing the graphene electronic device 100 shown in FIGS. 1A and 1B.

Figure 3A:
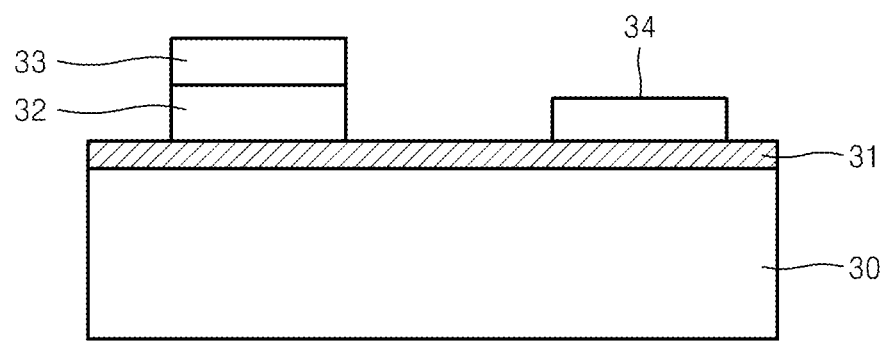
FIGS. 3A through 3D are diagrams illustrating an example embodiment of a method of manufacturing the graphene electronic device shown in FIG. 1A.

Referring to FIG. 3A, a semiconductor layer 32, a first conductive layer 33, and a second conductive layer 34 are formed on substrate 30 and 31. The substrate 30 and 31 may be formed of various substrate materials. For example, the substrate 30 and 31 may be a silicon substrate 30 on which a silicon oxide layer 31 is formed, a glass substrate, a SiC substrate, a GaN substrate, etc.

A semiconductor material layer is formed on the substrate 30 and 31 and patterned to form the semiconductor layer 32. A conductive material layer is formed on the semiconductor layer 32 and the substrate 30 and 31, patterned to form the first conductive layer 33 and the second conductive layer 34.

Figure 3B:
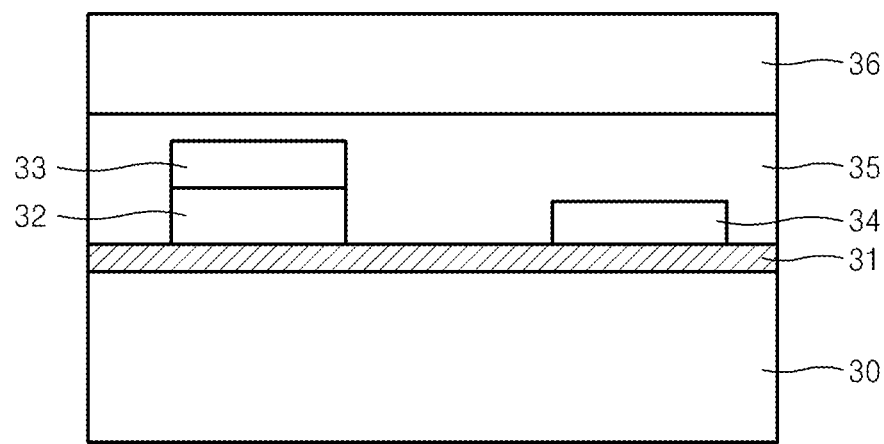

Referring to FIG. 3B, an insulating material is formed on the substrate 30 and 31, the semiconductor layer 32, the first conductive layer 33, and the second conductive layer 34 to form an intermediate layer 35. The intermediate layer 35 may be formed of an insulating material such as polymer, silicon oxide, silicon nitride, etc.

After forming the intermediate layer 35, a support structure 36 is formed on the intermediate layer 35. The support structure 36 is formed to support a device in post processes, and may be selectively omitted.

Figure 3C:
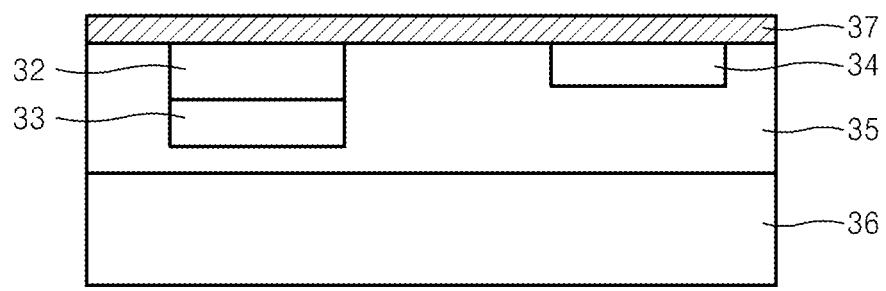

Referring to FIG. 3C, the substrate 30 and 31 are removed. The substrate 30 and 31 may be removed in various ways. For example, if the substrate 30 and 31 include silicon/silicon oxide, then the silicon oxide may be removed by etching. In addition, an interface area of the substrate 30 and 31 may be divided by irradiating laser in a laser lift-off (LLO) process. In this case, the substrate 30 and 31 may be used in a state where a material such as SiO:H, SiN:H, a-Si:H, AlO, ZnO, MgO, or GaN is formed on a transparent substrate such as glass by a plasma-enhanced CVD (PECVD) method. When the laser is irradiated to separate the substrates formed as described above, a gas is generated at an interface of the transparent substrate so that the transparent substrate may be separated. A graphene layer 37 is then formed on a portion from which the substrate 30 and 31 are separated.

Figure 3D:
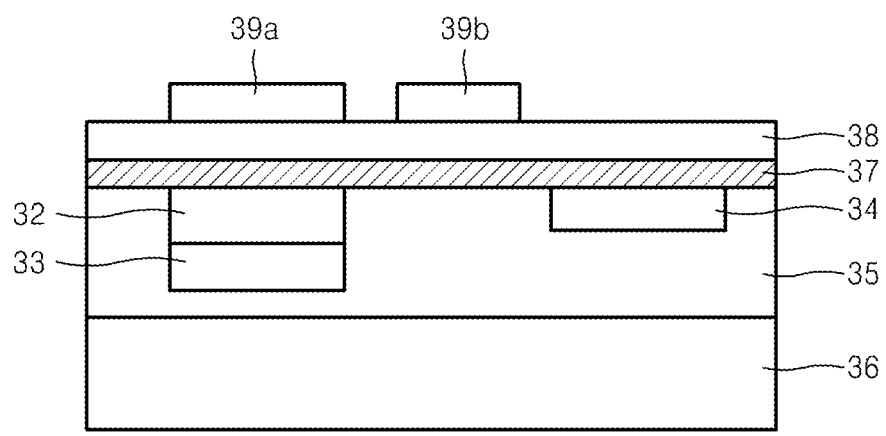

Referring to FIG. 3D, a gate insulating layer 38 is formed on the graphene layer 37. A conductive material is then applied on the gate insulating layer 38, and patterned to form a first gate 39a and a second gate 39b.

The graphene electronic device according to at least some example embodiments may be used to form various kinds of electronic devices according to a gate structure formed on a graphene layer.

Figure 4:
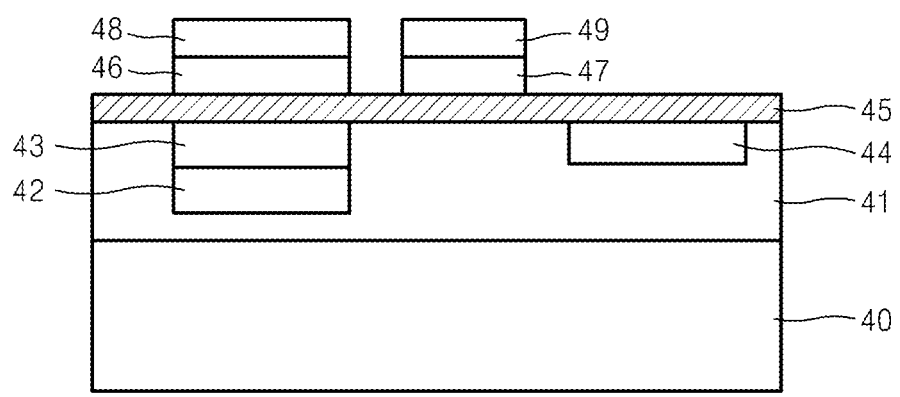
FIG. 4 is a cross-sectional view of an example embodiment of a ferroelectric memory device including graphene.

FIG. 4 is a cross-sectional view of an example embodiment of a ferroelectric random access memory (FRAM) device including graphene.

Referring to FIG. 4, an intermediate layer 41 is formed on a support structure 40, a first conductive layer 42 and a semiconductor layer 43 are formed on a first region of the intermediate layer 41, and a second conductive layer 44 is formed on a second region of the intermediate layer 41. A graphene layer 45 is formed on the intermediate layer 41, the semiconductor layer 43, and the second conductive layer 44. First and second gate structures are formed on the graphene layer 45. The first gate structure includes a ferroelectric layer 46 and a first gate 48. The second gate structure includes a ferroelectric layer 47 and a second gate 49. In this example embodiment, the first gate structure is formed on the graphene layer 45 to correspond to the first region of the intermediate layer 51, and the second gate structure is formed on the graphene layer 45 in a space between the first and second regions of the intermediate layer 41. The ferroelectric layers 46 and 47 may be formed of a ferroelectric material such as lead zirconate titanate (PZT), $BaTiO_3$, polyvinylidene difluoride (PVDF), etc. The memory device having the structure shown in FIG. 4 may be a 2-bit/cell memory device.

Figure 5:
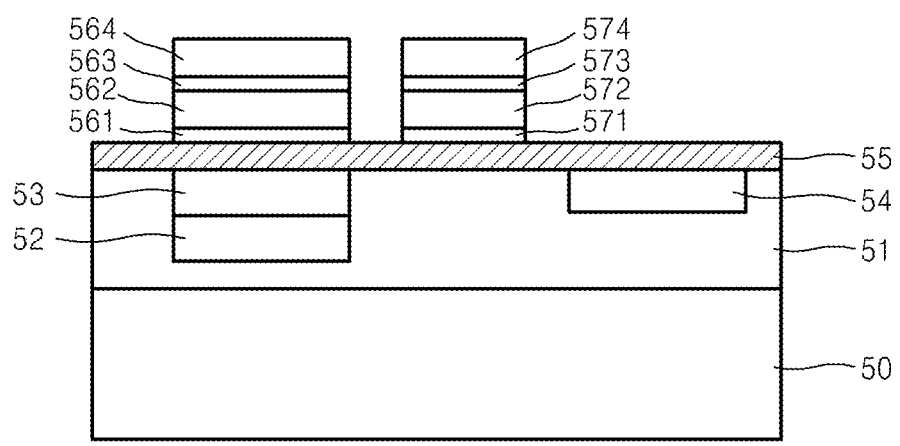
FIG. 5 is a cross-sectional view of an example embodiment of a flash memory device including graphene.

FIG. 5 is a cross-sectional view of an example embodiment of a flash memory device including graphene.

Referring to FIG. 5, the flash memory device includes an intermediate layer 51 formed on a support structure 50, a first conductive layer 52 and a semiconductor layer 53 formed on a first region of the intermediate layer 51, and a second conductive layer 54 formed on a second region of the intermediate layer 51. A graphene layer 55 is formed on the intermediate layer 51, the semiconductor layer 53, and the second conductive layer 54. A first gate structure and a second gate structure are formed on the graphene layer 55. The first gate structure is formed on the graphene layer 55 to correspond to the first region of the intermediate layer 51. The second gate structure is formed on the graphene layer 55 in a space between the first and second regions of the intermediate layer 51. The first gate structure includes a first tunneling oxide layer 561, a first floating gate 562, a first blocking oxide layer 563, and a first gate 564. The second gate structure includes a second tunneling oxide layer 571, a second floating gate 572, a second blocking oxide layer 573, and a second gate 574. The memory device shown in FIG. 5 may be a 2-bit/cell flash memory device.

Figure 6:
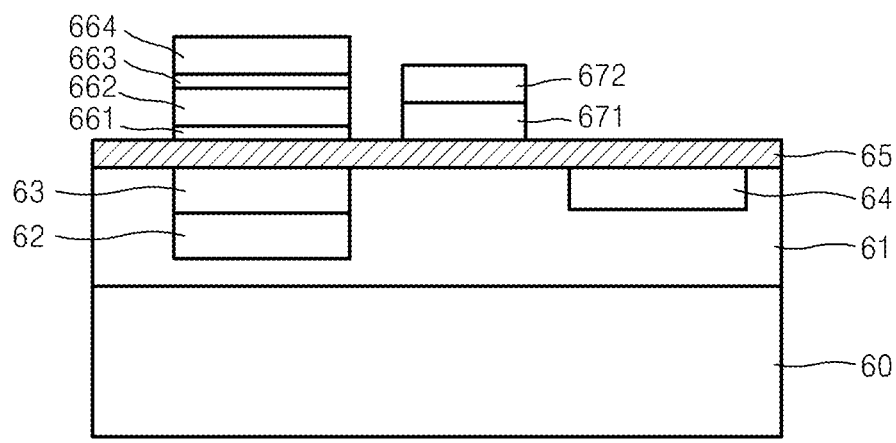
FIG. 6 is a cross-sectional view of an example embodiment of a hybrid-type memory device including graphene.

FIG. 6 is a cross-sectional view of an example embodiment of a hybrid-type memory device including graphene.

Referring to FIG. 6, the hybrid-type memory device includes an intermediate layer 61 formed on a support structure 60, a first conductive layer 62 and a semiconductor layer 63 formed on a first region of the intermediate layer 61, and a second conductive layer 64 formed on a second region of the intermediate layer 61. A graphene layer 65 is formed on the intermediate layer 61, the semiconductor layer 63, and the second conductive layer 64. A first gate structure and a second gate structure are formed on the graphene layer 65. The first gate structure is formed on the graphene layer 65 to correspond to the first region of the intermediate layer 61. The second gate structure is formed in a space between the first and second regions of the intermediate layer 61. The first gate structure includes a tunneling oxide layer 661, a floating gate 662, a blocking oxide layer 663, and a first gate 664. The second gate structure includes a ferroelectric layer 671 and a second gate 672. In the memory device shown in FIG. 6, the first gate structure is a flash memory region, and the second gate structure is a ferroelectric memory region. However, the first gate structure may be formed as a ferroelectric memory region including a ferroelectric layer and a gate, and the second gate structure may be formed as a flash memory region.

According to at least some example embodiments, graphene electronic devices having improved electrical characteristics by using graphene may be formed. Also, switching devices having characteristics of both graphene transistors and graphene diodes may be formed. In addition, memory devices having characteristics of both graphene transistors and graphene diodes may be formed.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A graphene electronic device comprising:
    a first conductive layer and a semiconductor layer on a first region of an intermediate layer;
    a second conductive layer on a second region of the intermediate layer;
    a graphene layer on the intermediate layer, the semiconductor layer, and the second conductive layer; and
    a first gate structure and a second gate structure on the graphene layer.

2. The device of claim 1, wherein the first gate structure corresponds to the first region of the intermediate layer.

3. The device of claim 1, wherein the second gate structure corresponds to a space between the first region and the second region of the intermediate layer.

4. The device of claim 1, wherein the intermediate layer is on a support structure.

5. The device of claim 1, wherein the first gate structure includes a gate insulating layer and a first gate.

6. The device of claim 5, wherein the second gate structure includes the gate insulating layer and a second gate.

7. The device of claim 1, wherein the first gate structure includes a first ferroelectric layer and a first gate.

8. The device of claim 7, wherein the second gate structure includes a second ferroelectric layer and a second gate.

9. The device of claim 1, wherein the first gate structure includes a first tunneling oxide layer, a first floating gate, a first blocking oxide layer, and a first gate.

10. The device of claim 9, wherein the second gate structure includes a second tunneling oxide layer, a second floating gate, a second blocking oxide layer, and a second gate.

11. A method of forming a graphene electronic device, the method comprising:
    forming a semiconductor layer, a first conductive layer, and a second conductive layer on a substrate;
    forming an intermediate layer on the substrate, the semiconductor layer, the first conductive layer, and the second conductive layer;
    forming a graphene layer on the intermediate layer, the semiconductor layer, and the second conductive layer; and
    forming a first gate structure and a second gate structure on the graphene layer.

12. The method of claim 11, further comprising:
    forming a support structure on the intermediate layer.

13. The method of claim 11, further comprising:
    removing the substrate.

14. The method of claim 13, wherein the substrate includes silicon and a silicon oxide layer, and wherein the substrate is removed by etching the silicon oxide layer.

15. The device of claim 13, wherein the substrate includes a transparent substrate, and wherein the substrate is removed by a laser lift-off process.

16. The device of claim 11, wherein the graphene layer is formed on a catalyst layer by a pyrolisis method or a chemical vapor deposition (CVD) method.

17. A graphene electronic device comprising:
    a graphene transistor having a channel including a graphene layer and an electrode including a semiconductor layer; and
    a graphene tunable diode having a diode region including the graphene layer and the semiconductor layer.

18. The device of claim 17, wherein the graphene transistor comprises:
    a first conductive layer and the semiconductor layer on a first region of an intermediate layer;

a second conductive layer on a second region of the intermediate layer;

the graphene layer on the intermediate layer, the semiconductor layer, and the second conductive layer; and a gate structure on the graphene layer.

19. The device of claim 18, wherein the gate structure includes a tunneling oxide layer, a floating gate, a blocking oxide layer, and a gate.

20. The device of claim 18, wherein the gate structure includes a ferroelectric layer and a gate.

21. The device of claim 17, wherein the graphene tunable diode comprises:

the semiconductor layer on a first region of an intermediate layer;

the graphene layer on the intermediate layer and the semiconductor-layer; and a gate structure on the graphene layer corresponding to the first region of the intermediate layer.

22. The device of claim 21, wherein the gate structure includes a ferroelectric layer and a gate.

23. The device of claim 21, wherein the gate structure includes a tunneling oxide layer, a floating gate, a blocking oxide layer, and a gate.

24. The device of claim 17, further comprising:

a first gate structure corresponding to the graphene transistor; and a second gate structure corresponding to the graphene tunable diode.

25. The device of claim 1, wherein the graphene layer is on top of the intermediate layer, the semiconductor layer, and the second conductive layer, the first conductive layer is between the intermediate layer and the graphene layer, the semiconductor layer is between the first conductive layer and the graphene layer, and the first gate structure and the second gate structure are spaced apart from each other on top of the graphene layer.

26. The method of claim 11, wherein the forming the graphene layer includes forming the graphene layer on top of the intermediate layer, the semiconductor layer, and the second conductive layer, the first conductive layer is between the intermediate layer and the graphene layer, the semiconductor layer is between the first conductive layer and the graphene layer, and the forming the first gate structure and the second gate structure includes forming the first gate structure and the second gate structure spaced apart from each other on top of the graphene layer.

27. The device of claim 17, wherein the device includes a first gate structure and a second gate structure spaced apart from each other on top of the graphene layer, and the graphene layer is on top of the semiconductor layer.

* * * * *